US008119335B2

(12) United States Patent
Bearinger et al.

(10) Patent No.: US 8,119,335 B2
(45) Date of Patent: Feb. 21, 2012

(54) METHODS AND APPARATUS FOR SELECTIVE, OXIDATIVE PATTERNING OF A SURFACE

(76) Inventors: Jane P. Bearinger, Livermore, CA (US); Jeffrey A. Hubbell, Zurich (CH); Kenneth J. Michlitsch, Livermore, CA (US)

( * ) Notice: Subject to any disclaimer, the term of this patent is extended or adjusted under 35 U.S.C. 154(b) by 1802 days.

(21) Appl. No.: 11/333,090

(22) Filed: Jan. 17, 2006

(65) Prior Publication Data

US 2006/0127595 A1 Jun. 15, 2006

Related U.S. Application Data

(62) Division of application No. 10/418,858, filed on Apr. 18, 2003, now abandoned.

(60) Provisional application No. 60/373,879, filed on Apr. 19, 2002.

(51) Int. Cl.
*C08F 2/54* (2006.01)
*C08F 2/48* (2006.01)
*G03F 7/00* (2006.01)

(52) U.S. Cl. .................... 430/322; 430/942; 430/270.1; 427/487; 427/496

(58) Field of Classification Search ........................ None
See application file for complete search history.

(56) References Cited

U.S. PATENT DOCUMENTS 4,388,383 A 6/1983 Heller
4,690,715 A 9/1987 Allara et al.
4,717,645 A 1/1988 Kato et al.
4,731,786 A 3/1988 MacGowan et al.
4,795,692 A 1/1989 Anderson et al.
4,868,241 A 9/1989 Hiscock et al.
4,997,576 A 3/1991 Heller et al.
5,037,476 A 8/1991 Degani et al.
5,178,989 A 1/1993 Heller et al.
5,194,161 A 3/1993 Heller et al.
5,286,599 A 2/1994 Babich et al.
5,512,131 A 4/1996 Kumar et al.
5,686,548 A 11/1997 Grainger et al.
6,020,047 A 2/2000 Everhart
6,027,766 A 2/2000 Greenberg et al.
6,048,623 A 4/2000 Everhart et al.
6,060,327 A 5/2000 Keen
6,083,697 A 7/2000 Beecher et al.
6,183,815 B1 2/2001 Enick et al.
6,195,156 B1 * 2/2001 Miyamoto et al. .............. 355/85
6,238,738 B1 5/2001 McCurdy
6,294,313 B1 9/2001 Kobayashi et al.
6,307,620 B1 10/2001 Takabayashi et al.
6,337,161 B2 1/2002 Chiba et al.
6,449,332 B1 9/2002 Chiba
6,534,240 B1 3/2003 Hoshi
6,558,448 B2 5/2003 Hu
6,770,436 B1 8/2004 Beecher et al.
6,800,405 B2 10/2004 Kobayashi
6,803,175 B2 10/2004 Kobayashi
6,811,945 B2 11/2004 Kobayashi
6,846,616 B2 1/2005 Kobayashi et al.
7,091,127 B2 * 8/2006 Hubbell et al. ............... 438/704
2001/0038950 A1 11/2001 Chiba et al.
2001/0043320 A1 11/2001 Kato et al.
2002/0006558 A1 1/2002 Kobayashi et al.
2003/0008217 A1 1/2003 Kobayashi
2003/0059906 A1 3/2003 Hubbell et al.
2003/0087073 A1 5/2003 Kobayashi
2003/0194617 A1 10/2003 Kobayashi

FOREIGN PATENT DOCUMENTS

WO WO 03/024186 3/2003
WO WO 03/024897 3/2003

* cited by examiner

*Primary Examiner* — Daborah Chacko Davis

(57) ABSTRACT

The present invention provides methods and apparatus for selectively patterning surfaces using radical species generated with a photocatalyst. The photocatalyst may comprise a photocatalytic semiconductor or a photosensitizer. The radical species are brought into contact with an oxidizable coating disposed on the surface, thereby locally oxidizing and selectively patterning the surface. The photocatalyst is preferably disposed on a delivery device, such as a stamp, mask, or scanning probe, that is brought into close proximity or contact with the coated surface. The photocatalyst is then excited in a manner capable of generating radical species, for example, oxygen-containing radical species, in appropriate media. It is expected that these radical species will be transferred to the coated surface along a substantially shortest distance path, thereby locally oxidizing and patterning the surface.

20 Claims, 16 Drawing Sheets

METHODS AND APPARATUS FOR SELECTIVE, OXIDATIVE PATTERNING OF A SURFACE

REFERENCE TO RELATED APPLICATION

The present application is a Divisional application of, and claims priority from, U.S. patent application Ser. No. 10/418,858, filed Apr. 18, 2003 now abandoned, which claims priority and the benefit of the filing date of provisional U.S. patent application Ser. No. 60/373,879, filed Apr. 19, 2002. Both of these applications are incorporated herein by reference in their entireties.

FIELD OF THE INVENTION

The present invention is related to surface patterning. More particularly, this invention is related to methods and apparatus for selectively patterning a surface using radical species, thereby providing a surface with a specified and controllable gradient of electrical, chemical, and/or physical properties.

BACKGROUND OF THE INVENTION

Electron beam ("e-beam") lithography has successfully been employed in a variety of industrial applications to fabricate very small structures. An e-beam is focused on a target substrate to slowly and painstakingly 'draw', 'carve', or ablate a very fine pattern into the substrate. This procedure is repeated for each substrate required. E-beam lithography typically is capable of producing features having a dimension or resolution on the order of nanometers.

Though often effective, e-beam lithography is prohibitively slow and expensive for many applications, and is not readily applicable to mass-production. Techniques therefore have been developed to lower costs, decrease production times, and increase reproducibility. One such technique comprises using e-beam lithography to create a master, from which a stamp may be secondarily created. A stamping material (ink) is applied to the stamp, which is subsequently brought into contact with a surface. The stamping material is transferred to the surface at locations where the stamp contacts the surface. The surface may then be etched to remove surface material at all points that do not have stamping material, thereby replicating the stamp and selectively patterning the surface. Stamping of alkane thiols typically is capable of producing features having a dimension or resolution on the order of microns, though smaller structures are theoretically attainable.

Stamping of alkane thiols from a stamp onto a gold surface has been extensively investigated. The alkane thiol is absorbed either into or onto the stamp, and is then brought into contact with the gold substrate surface. Alkane thiols commonly consist of close-packed, independent chains that may be chemisorbed to a surface, and which often are used to modify surfaces, for example, to alter corrosion resistance and/or electrical properties, or to pattern the surfaces. Common alkane thiols include octadecanethiol and hexadecanethiol. These materials are typically applied from solution, e.g. ethanol or hexane, to surfaces such as gold, silver, or copper.

Although stamping of alkane thiols on gold surfaces has been extensively investigated, to date the method is still primarily a laboratory technique that has not been effectively transferred to industrial settings, due to the complexities of the stamping process. The simultaneous and often contradictory requirements of rapid diffusion and high solubility of the alkane thiol onto the stamp, appropriate mechanical characteristics of the stamp, fast reaction rates relative to surface diffusion rates of the alkane thiol onto the gold substrate, high irreversibility on the gold surface, and resistance of the stamping material to subsequent processing steps have been difficult to achieve. Thus, a central factor limiting adaptation of the laboratory technique to industrial applications has been the difficulties encountered while trying to achieve simultaneous control of multiple time-dependent, or rate, processes.

A newer surface patterning technique that has been developed to lower costs and decrease production times associated with e-beam lithography employs e-beam, UV, or x-ray resists. Such resists, and techniques for manufacturing them, are found, for example, in U.S. Pat. No. 4,717,645 to Kato et al.; U.S. Pat. No. 4,795,692 to Anderson et al.; and U.S. Pat. No. 4,868,241 to Hiscock et al.; all of which are incorporated herein by reference. A common resist technique comprises coating a substrate with a material that is sensitive to e-beam, UV, or x-ray radiation. The coating is selectively exposed to radiation, for example, with a focused electron beam that 'traces' the required pattern on the coating. Irradiation removes the coating at the point of exposure and provides a selectively patterned surface. This technique is similar to traditional e-beam lithography, except that the affected material comprises only a very thin, typically organic coating, thereby reducing the amount of material that is removed and the amount of time required to achieve patterning. The size of features attainable using resists depends on the energy source used for irradiation.

A significant drawback of resist techniques is that, although more rapid than traditional e-beam lithography techniques, time- and cost-intensive patterned irradiation of resists must still be conducted individually for each patterned surface. This drawback significantly limits the industrial viability of e-beam and x-ray resists.

Yet another technique that reduces the costs and production times associated with e-beam lithography is photolithography. Photolithography was developed prior to e-beam techniques, but provides many of the benefits of stamping and resist techniques. Photolithography typically requires production of a Master mask. The mask is placed over a substrate that has been coated with a photosensitive resist. A light source is shone through the patterned mask onto the resist, thereby patterning the surface. With a positive resist, material may be easily removed at all points on the surface that are exposed to irradiation. With a negative resist, material may be removed at all points not irradiated.

Although photolithography provides many of the benefits of e-beam lithography in a rapid and low cost procedure, the technique has fundamental limits. Specifically, photolithography typically cannot pattern surface structures having a size much smaller than the wavelength of the incident light. When using an i-line standard (365 nm UV light generated with mercury lamps) energy source, features on the order of about 500 nm are possible. Advanced focusing techniques may allow features slightly smaller than the wavelength of the incident light, for example, features as small as 300 nm with the i-line standard, but significantly smaller features are not possible.

Researchers have also examined the possibility of patterning with deep UV ("DUV") light having a wavelength of 248 nm, generated with a krypton fluoride ("KrF") excimer laser energy source 18. Furthermore, researchers have explored 193 nm laser sources 18, such as argon fluoride ("ArF") excimer lasers. Researchers are still further exploring 157 nm laser sources 18, in the hopes of patterning surface features on the order of about 100 nm, when using advanced focusing techniques. However, systems using focusing techniques and operating at or below about 193 nm may suffer from degraded optics, since most lens materials, including fused silica or quartz, are absorptive at these wavelengths. Density variations in materials are also a problem at or below about 193 nm. Exotic alternative lens materials therefore are being examined, including, for example, calcium fluoride. Although calcium fluoride is highly transmissive, a significant drawback is that it is very difficult to fabricate. Additionally, if extreme UV (13 nm) or X-ray (<3 nm) are light sources ever considered for mass-production purposes, such as in the production of microelectronics, it is expected that complex and cost-intensive new lasers or synchrotron systems will be required to generate adequate extreme UV or X-ray photons to meet production requirements.

Especially in the field of microelectronics, the drive for smaller and smaller structures is rapidly creating a need to pattern surface structures smaller than those possible today with standard photolithography employing i-line standard UV light. In many cases, traditional e-beam techniques are the only practical recourse for providing such fine structures.

In view of the drawbacks associated with prior art patterning techniques, it would be desirable to provide methods and apparatus for patterning surfaces that overcome these drawbacks.

It would be desirable to provide methods and apparatus that reduce costs and production times, as compared to e-beam techniques.

It also would be desirable to provide methods and apparatus for patterning surfaces that require control of fewer rate processes.

It would be desirable to provide methods and apparatus for patterning surfaces that may be replicated using a stamping or masking technique.

It would be desirable to provide methods and apparatus that theoretically enable patterning of surface structures having a size smaller than achievable with standard photolithography techniques.

It would be desirable to provide methods and apparatus that are applicable to industrial applications.

SUMMARY OF THE INVENTION

In view of the foregoing, it is an object of the present invention to provide methods and apparatus for patterning surfaces that overcome drawbacks associated with prior art techniques.

It is an object to provide methods and apparatus that reduce costs and production times, as compared to e-beam techniques.

It is another object of the present invention to provide methods and apparatus that require control of fewer rate processes.

It is yet another object to provide methods and apparatus for patterning surfaces that may be replicated using a stamping or masking technique.

It is still another object to provide methods and apparatus that theoretically enable patterning of surface structures having a size smaller than achievable with standard photolithography techniques.

It is an object to provide methods and apparatus that are applicable to industrial applications.

These and other objects of the present invention are accomplished by patterning a surface using radical species generated with a photocatalyst, for example, a photocatalytic semiconductor, a photosensitizer, or a combination thereof. The radical species are selectively brought into contact with an oxidizable coating disposed on the surface.

In a preferred embodiment, the oxidizable surface coating is adsorbed onto the surface. The coated surface is preferably immersed in a medium capable of generating radical species in the presence of electron hole pairs or excited molecules, for example, an oxygen- or nitrogen-containing medium. The medium may be either organic or inorganic and is preferably fluidic, for example, a gaseous medium, a liquid medium, an aqueous medium, a gel, water, or air. Furthermore, the medium preferably comprises an oxidant, such as oxygen, nitrogen, oxidizing ions, Redox species, Redox mediators, or electron transfer agents. The medium may also or alternatively contain stabilizing agents, such as selenium, zinc, lipoic acid, methionine, cysteine, or N,N Dimethyl glycine. As yet another alternative, the medium may comprise more inert conditions, such as vacuum or Argon gas. Other mediums will be apparent to those of skill in the art.

A stamp or mask, formed, for example, using traditional e-beam lithography techniques, per se known, is brought into close proximity or contact with the coated surface. The mask comprises a patterned layer of material that is capable of generating radical species, for example, a patterned photocatalyst layer. When the photocatalyst comprises a photocatalytic semiconductor, $TiO_2$ is a preferred photocatalytic semiconductor, but others, such as $SnO_2$, or an $InTaO_4$ compound doped with Ni, will be apparent to those of skill in the art and are included in the scope of the present invention. When the photocatalyst comprises a photosensitizer or photosensitizing agent, preferred photosensitizers include photofrins, texaphyrins, metallotexaphyrins, porphyrins, hematoporphyrins, chlorins, bacteriochlorins, phthalocyanines and purpurins. Additional photosensitizers will be apparent to those skilled in the art and are included in the present invention.

Next, an energy source is exposed through the mask/stamp to the patterned photocatalyst layer. It is expected that the photocatalyst will generate radical species in appropriate environments upon exposure to the energy source. When the photocatalyst comprises a photocatalytic semiconductor, preferred light sources include UV or x-ray lamps or lasers. Other light sources will be apparent to those skilled in the art. Energy from the light source generates electron hole pairs in/on the patterned photocatalytic semiconductor layer, for example, in a patterned layer of $TiO_2$. The electron hole pairs generate radical species, such as oxygen-containing radical species, in appropriate environments.

When the photocatalyst comprises a photosensitizer, preferred light sources include visible light sources, such as lights sources with wavelengths between about 550-850 nm, for example, a visible laser light source, such as a Helium Neon ("HeNe") laser. Other light sources, such as UV light sources, will be apparent. Energy from the light source excites the photosensitizer from a ground state to a singlet excited state. The singlet may decay to an intermediate triplet excited state, which is able to transfer energy to another triplet. Some molecules have a triplet ground state, for example, oxygen or $O_2$. Thus, energy may be transferred from the photosensitizer in the excited triplet state to the triplet ground state molecule, thereby exciting the molecule to a singlet state. A radical-generating reaction may then be achieved with the excited singlet state molecule, for example, a reaction generating oxygen-containing radical species. Other molecules capable of forming radical species upon exposure to an excited photosensitizer will be apparent to those of skill in the art, for example, thiohydroxamic esters.

Regardless of whether the patterned photocatalyst layer comprises a patterned photocatalytic semiconductor layer or a patterned photosensitizer layer, it is expected that radical species generated at the patterned photocatalyst layer will be transferred to the coated surface along a substantially shortest distance path. Thus, only areas on the coated surface that are in close proximity to the patterned layer of the mask/stamp will come into contact with the radical species. Since the surface coating is oxidizable, it is expected that these areas will oxidize locally, thereby patterning the surface. Portions that are not contacted by the radical species are not expected to oxidize. It should also be noted that oxidation may be possible with excited singlet or triplet state molecules, in addition to radical species.

Techniques of the present invention potentially may be used in combination with prior art photosensitive resists. Such local patterning through chemical modification of the coating is expected to alter the reactivity of the coating, and may either stabilize or destabilize the affected portion of the coated surface. Unaffected adsorbed material optionally may be used for a second chemical step, for example, a second masking step.

An expected advantage of the present invention, as compared to prior art photolithography techniques, is that the patterned mask/stamp's photocatalyst layer will enable patterning of features on the coated surface that are significantly smaller than the wavelength of light generated by the energy source. When using a photocatalytic semiconductor, this is possible because electron hole pairs generated in the photocatalytic semiconductor layer have a dimension on the order of sub-Angstroms, as compared to the incident light that generates the electron hole pairs, which has a dimension on the order of nanometers. Likewise, when using photosensitizers, the radical species generated with the photosensitizers by quanta of energy transmitted to molecules, are expected to be significantly smaller than the wavelength of incident light.

An alternative embodiment of apparatus in accordance with the present invention comprises a scanning probe having a photocatalyst tip. An energy source is coupled to the tip, for example, via fiber optics or near-field optical microscopy, such that radical species may be generated locally at the tip. By scanning the probe over an oxidizable surface coating while creating radical species, a selectively patterned surface may be formed.

It is expected that the present invention may be used in conjunction with a variety of oxidizable surface coatings. In a first embodiment, the surface coatings comprise alkane thiols. In a second embodiment, the coatings comprise thioethers. In a third embodiment, the coatings comprise unsaturated materials. Saturated materials are also contemplated. In a fourth embodiment, the coatings comprise metal oxides. Bare metal substrates may also be used. Other coatings will be apparent to those skilled in the art.

The present invention may be applicable to a variety of fields ranging from fabrication of microelectronics, computer chips, biomedical assays, physical research (e.g. top gates and quantum dots or wells), and combinatorial chemistry. Additional applications will be apparent to those of skill in the art, and are included in the present invention.

Methods and apparatus for accomplishing the present invention are provided.

BRIEF DESCRIPTION OF THE DRAWINGS

Further features of the invention, its nature and various advantages will be more apparent from the accompanying drawings and the following detailed description of the preferred embodiments, in which like reference numerals refer to like parts throughout, and in which:

FIGS. 2A and 2B depict the formation of electron hole pairs in a photocatalytic semiconductor, while FIG. 2C depicts excitation of a photosensitizer;

FIG. 10 are overhead views, except for FIG. 10C, which is a side view.

DETAILED DESCRIPTION OF THE INVENTION

The present invention is related to surface patterning. More particularly, this invention is related to methods and apparatus for selectively patterning a surface using radical species, thereby providing a surface with a specified and controllable gradient of electrical, chemical, and/or physical properties.

Figure 1:
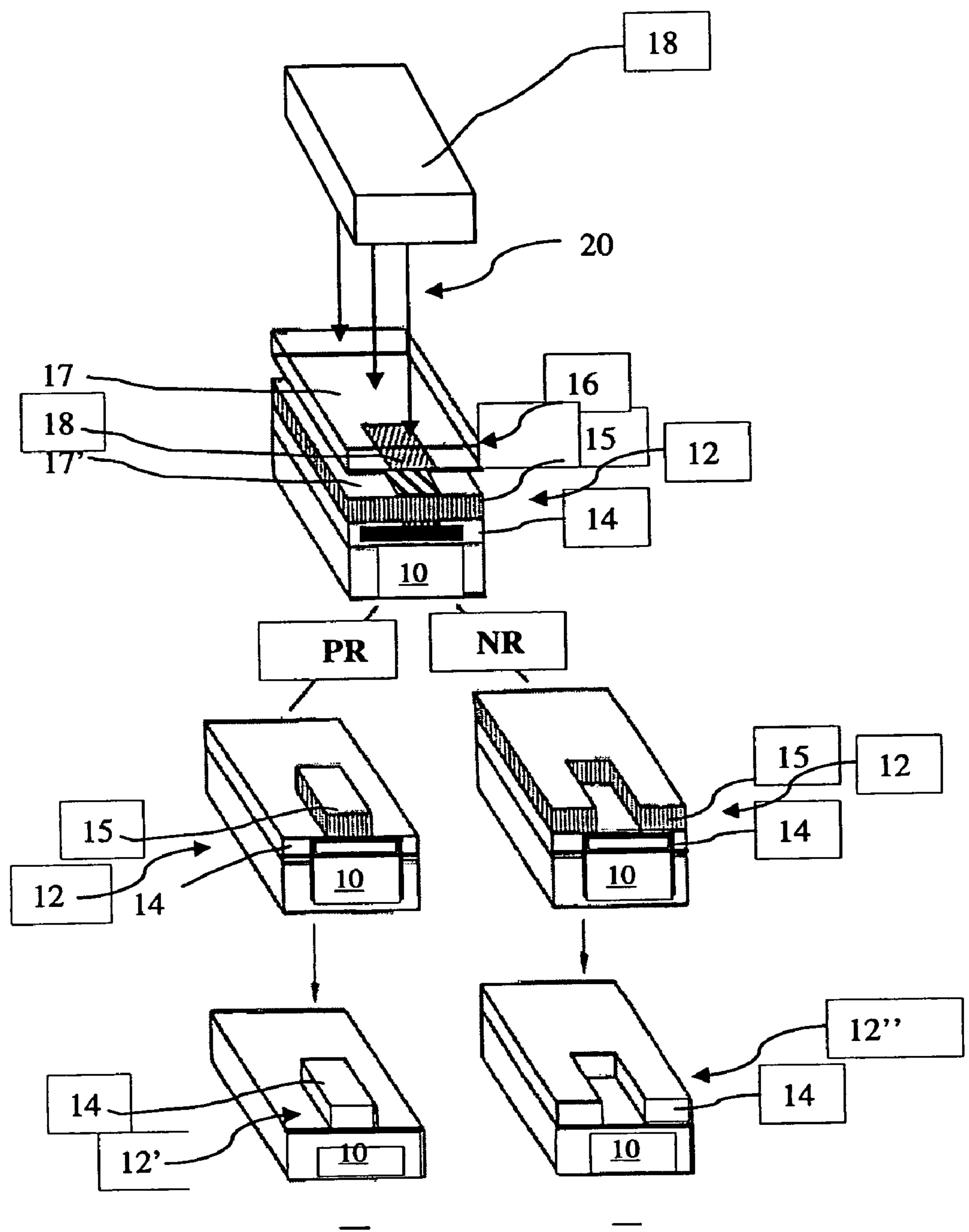
FIG. 1 is a schematic representation of a prior art technique for performing photolithography.

With reference to FIG. 1, a prior art technique for performing photolithography is described. Substrate 10 comprises surface 12 having oxide 14 and photosensitive resist coating 15. Mask 16, having transparent pattern section 17 and opaque masking section 18, is disposed above oxide 14 and coating 15, while energy source 19 is disposed above mask 16. Energy source 19 typically comprises a UV or x-ray energy source.

A common technique for forming substrate 10 with surface 12, oxide 14, and photosensitive resist coating 15 comprises providing a doped silicon substrate 10. Oxide 14 is then grown on substrate 10. Next photoresist 15 is spun-coated onto the oxide.

With mask 16 disposed between surface 12 and energy source 18, the energy source is activated and irradiates mask 16 with incident light 20. Incident light 20 passes through mask 16 along pattern section 17, and contacts photosensitive resist coating 15 in a pattern 17'. Pattern 17' replicates pattern section 17 of mask 16 on surface 12. Masking section 18 inhibits transmission of light 20 to surface 12.

Resist coating 15 may be either a positive or a negative resist coating. With positive resist coating PR, coating 15 may be easily removed at all points on surface 12 disposed within pattern 17' that are exposed to irradiation, for example, via a developing procedure. With negative resist NR, material may be removed at all points on surface 12 that are not disposed within pattern 17', again via a developing procedure. Oxide 14 may then be removed at all points where photosensitive resist coating 15 has been removed, for example, via a secondary etching procedure. Selective removal of oxide 14 provides selectively patterned surfaces 12' and 12", respectively.

Although photolithography provides many of the benefits of e-beam lithography in a rapid and low cost procedure, the technique has fundamental limits. Specifically, photolithography typically cannot pattern surface structures having a size much smaller than the wavelength of the incident light from energy source 18. This means that the minimum size of structures contained within pattern 17 of mask 16 must be close to the dimensions of the wavelength of the incident light, and the resultant selective pattern 17' formed on surface 12 will not have any structures significantly smaller or finer than the structures within mask pattern 17.

When using an i-line standard (365 nm UV light generated with mercury lamps) energy source 18, features on the order of about 500 nm are possible. Advanced focusing techniques may allow features or structures slightly smaller than the wavelength of the incident light, for example, features as small as 300 nm, but features significantly smaller than the wavelength of the incident light have not been achieved. Structures on the order of 300-500 nm may not be sufficient in a variety of applications, including microelectronics. Thus, expensive and time-consuming e-beam techniques may be required.

Researchers have also examined the possibility of patterning with deep UV ("DUV") light having a wavelength of 248 nm, generated with a krypton fluoride ("KrF") excimer laser energy source 18. Furthermore, researchers have explored 193 nm laser sources 18, such as argon fluoride ("ArF") excimer lasers. Researchers are still further exploring 157 nm laser sources 18, in the hopes of patterning surface features on the order of about 100 nm, when using advanced focusing techniques. However, systems using focusing techniques and operating at or below about 193 nm may suffer from degraded optics, since most lens materials, including fused silica or quartz, are absorptive at these wavelengths. Density variations in materials are also a problem at or below about 193 nm. Exotic alternative lens materials therefore are being examined, including, for example, calcium fluoride. Although calcium fluoride is highly transmissive, a significant drawback is that it is very difficult to fabricate. Additionally, if extreme UV (13 nm) or X-ray (<3 nm) are light sources ever considered for mass-production purposes, such as in the production of microelectronics, it is expected that complex and cost-intensive new lasers or synchrotron systems will be required to generate adequate extreme UV or X-ray photons to meet production requirements.

Referring now to FIGS. 2 and 3, prior to discussion of apparatus and methods in accordance with the present invention, reactions encountered while practicing the present invention are described. Although these reactions are believed to be the mechanism by which the present invention may be practiced, the present invention is primarily concerned with the end result, i.e. patterning. Thus, the reactions and purported mechanism are provided only for the benefit of the reader and should in no way be construed as limiting.

Figure 2A:
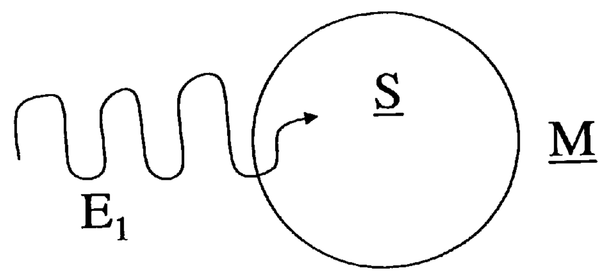
FIGS. 2A-2C are schematic representations of photocatalyst reactions leading to generation of radical species.
Figure 2B:
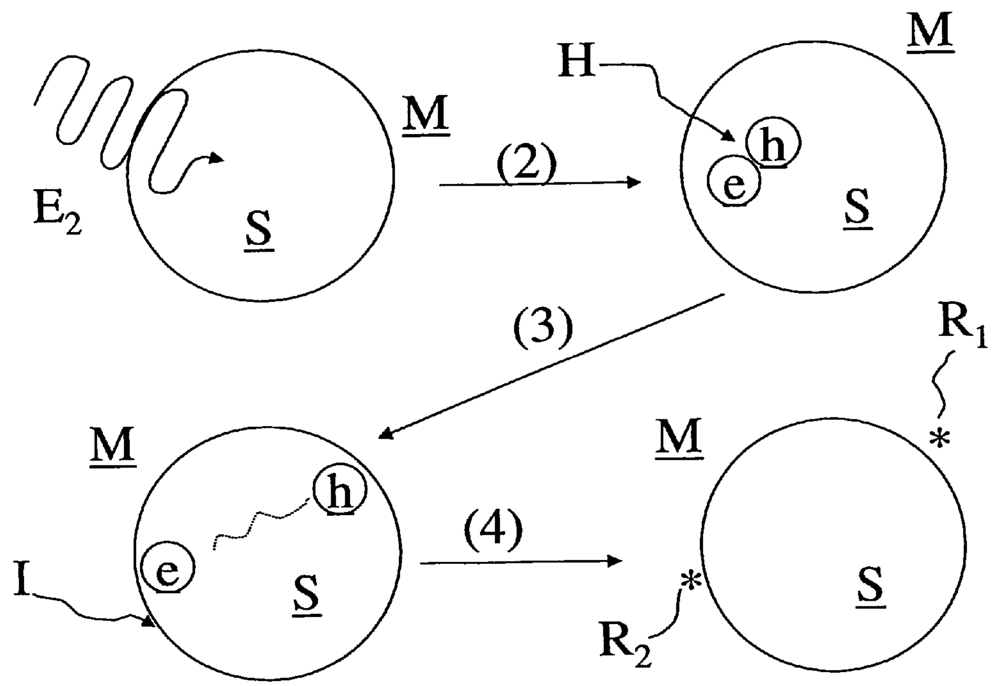
Figure 2C:
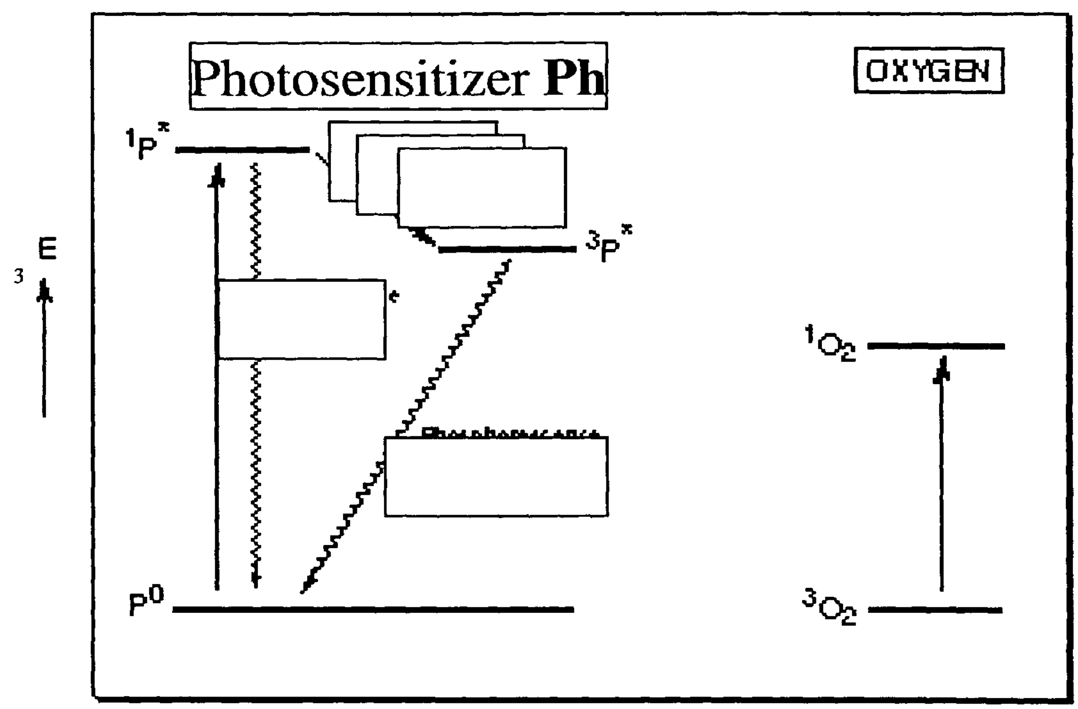

With reference to FIG. 2, photocatalyst reactions leading to generation of radical species are described. FIGS. 2A and 2B depict the formation of an electron hole pair in a photocatalytic semiconductor atom, with subsequent generation of radical species. FIG. 2C depicts excitation of a photosensitizer.

In FIG. 2A, photocatalytic semiconductor atom S is disposed in an oxygen-containing medium M, for example, $H_2O$. Semiconductor atom S is contacted by energy quanta $E_1$ having an excitation energy below the band gap energy of semiconductor atom S. As an illustrative example, the band gap energy for photocatalytic semiconductor $TiO_2$ is about 3.2 eV. Since energy quanta $E_1$ has an excitation energy below the band gap of semiconductor atom S, the quanta does not generate an electron hole pair in semiconductor atom S.

In FIG. 2B, semiconductor atom S is contacted by energy quanta $E_2$ having an excitation energy above the band gap of semiconductor atom S. Energy quanta $E_2$ releases electron e and hole h within semiconductor S, which are collectively referred to as electron hole pair H. Electron hole pair H migrates to atom/medium interface I. Electron e and hole h interact with oxygen contained within medium M, thereby forming oxygen-containing radical species $R_1$ and $R_2$. $R_1$ is a hydroxyl radical, while $R_2$ is a super-anion oxide radical. Radical species $R_1$ and $R_2$ have cross-sections on the order of Angstroms or smaller. After a brief period, electron hole pairs that don't form radical species recombine.

For the exemplary embodiment of a $TiO_2$ photocatalytic semiconductor atom S exposed to energy quanta $E_2$ from a UV energy source, while immersed in fluid medium M comprising $H_2O$, the equations governing generation of radical species are as follows:

$$TiO_2+UV\text{->}e+h \quad (1)$$

$$h+OH\text{—->}{*}OH \quad (2)$$

$$e+O_2\text{->}O_2{*}\text{—} \quad (3)$$

$$O_2{*}\text{—}+H_2O\text{->}HO_2{*}+OH\text{—} \quad (4)$$

where '*' denotes a radical species. This provides an overall reaction via $TiO_2$ catalysis of:

$$UV+O_2+H_2O\text{->}HO_2{*}+{*}OH \quad (5)$$

Although FIGS. 2A and 2B are described with respect to an oxygen-containing medium, other mediums containing other elements capable of generating radical species in the presence of electron hole pairs will be apparent to those of skill in the art. One such medium is a nitrogen-containing medium. Others include reagents that may react across an unsaturated bond via a Michael-type addition mechanism.

Referring now to FIG. 2C, photosensitizer Ph is excited from ground state $P^0$ to excited singlet state $^1p^*$ by energy quanta $E_3$. Photosensitizer Ph decays from singlet state $^1p^*$ to intermediate excited triplet state $^3p^*$. While disposed in the triplet state, photosensitizer Ph is able to transfer energy to another triplet state molecule. Some molecules have a triplet ground state, for example, oxygen $O_2$, which is used in the exemplary embodiment of FIG. 2C.

As seen in FIG. 2C, energy is transferred from excited triplet state photosensitizer $^3p^*$ Ph to triplet ground state oxygen molecule $^3O_2$, thereby exciting the $^3O_2$ molecule to an excited singlet state $^1O_2$. A radical-generating reaction may then be achieved with the excited singlet state molecule $^1O_2$, for example, a reaction that generates oxygen-containing radical species. Other molecules capable of forming radical species upon exposure to an excited photosensitizer will be apparent to those of skill in the art, for example, thiohydroxamic esters.

With reference to FIG. 3, oxidation of a surface coating in the presence of radical species is described. It should also be noted that oxidation may be possible with excited singlet or triplet state molecules, in addition to radical species. In FIG. 3A, oxidizable surface coating C, disposed on substrate Su, is contacted by radical species R. Radical species R causes surface coating C to locally oxidize where the radical species contacts the surface coating at point P, as seen in FIG. 3B. The cross-section of point P may be on the order of angstroms or smaller.

Figure 3A:
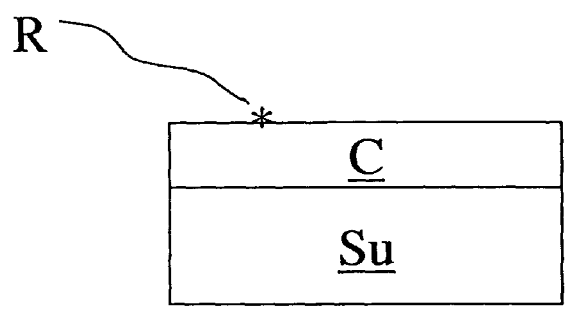
FIGS. 3A-3D are schematic representations of chemical reactions demonstrating oxidation of a surface coating in the presence of radical species.
Figure 3B:
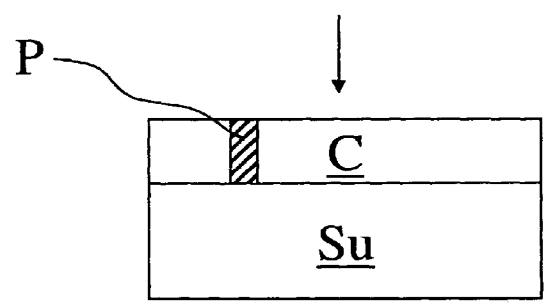
Figure 3C:
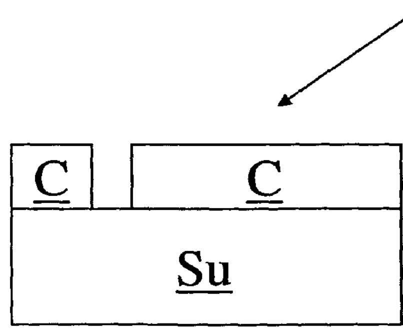
Figure 3D:
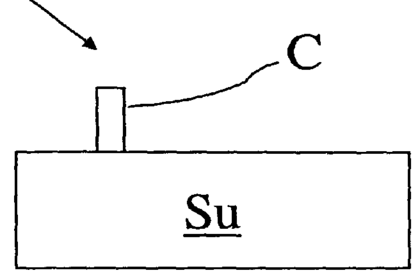

The chemistry of coating C may be chosen such that the reactivity of the coating may be altered at point P, and may either stabilize or destabilize point P of coating C. For example, dependent on the chemistry of coating C and/or secondary processing techniques, point P of coating C may be removed from coating C, as seen in FIG. 3C. Alternatively, coating C may be removed from substrate Su at all positions except point P, as seen in FIG. 3D.

With reference now to FIG. 4, a first embodiment of apparatus in accordance with the present invention is described. Apparatus 30 comprises substrate 32 having surface 34 with oxidizable coating 36. Apparatus 30 further comprises mask 40 having mask section 42 and pattern section 44. Photocatalyst layer 46 is disposed beneath mask section 42 and pattern section 44. Apparatus 30 also comprises energy source 50. Apparatus 30 still further comprises medium M in which oxidizable coating 36 and photocatalyst layer 46 are immersed. Mask 40 is disposed between substrate 32 and energy source 50.

Mask section 42 of mask 40 preferably comprises a shielding material, for example, a UV or x-ray absorber or quencher, carbon, or a metal such as lead, or gold, which is capable of inhibiting transmission of energy irradiated by energy source 50. Mask section 42 may also comprise a material capable of quenching radical species, such as selenium or zinc. Additional materials for mask section 42 will be apparent to those of skill in the art.

Figure 4A:
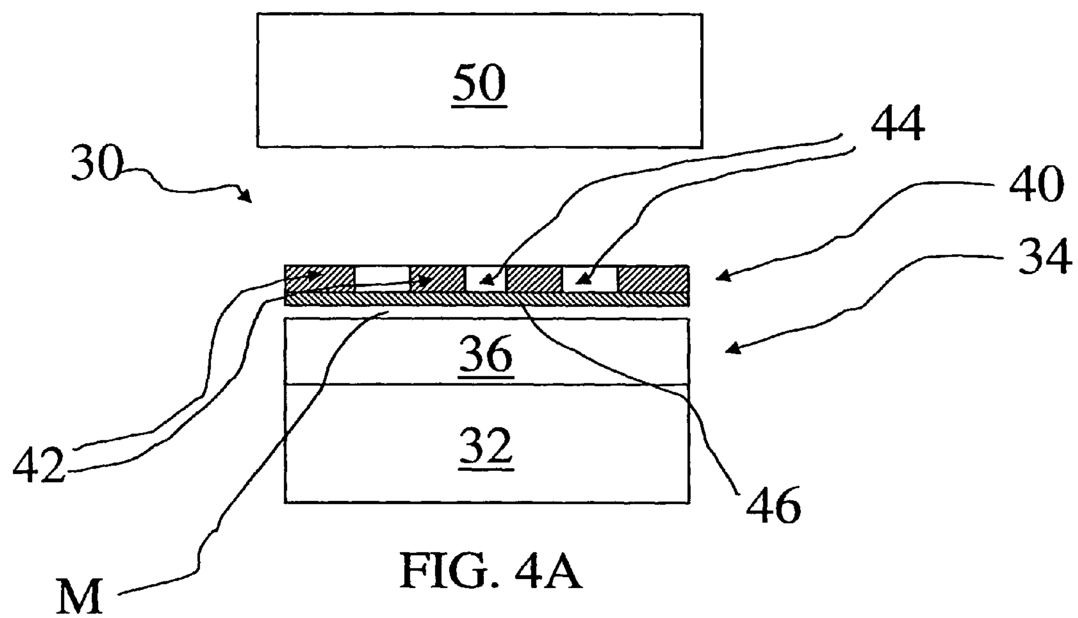
FIGS. 4A-4C are schematic representations of a first embodiment of apparatus constructed in accordance with the present invention.

Pattern section 44 comprises the portion of mask 40 defining the pattern to be replicated on surface 34 of substrate 32. In FIG. 4A, pattern section 44 comprises either a material capable of transmitting energy provided by energy source 50, or voids formed within mask section 42, for example, drilled within mask section 42 to expose photocatalytic semiconductor layer 46. Pattern section 44 further comprises the portions of layer 46 disposed beneath such voids or transmitting material.

Photocatalyst layer 46 may comprise a photocatalytic semiconductor layer, a photosensitizer layer, or a combination thereof. For the purposes of the present invention, a photocatalyst is defined as a material that is capable of producing a photochemical and/or photophysical alteration in a system, without being consumed by the alteration. When the photocatalyst comprises a photocatalytic semiconductor, $TiO_2$ is a preferred photocatalytic semiconductor, but others, such as $SnO_2$, or an $InTaO_4$ compound doped with Ni, will be apparent to those of skill in the art and are included in the scope of the present invention. When the photocatalyst comprises a photosensitizer or photosensitizing agent, preferred photosensitizers include photofrins, texaphyrins, metallotexaphyrins, porphyrins, hematoporphyrins, chlorins, bacteriochlorins, phthalocyanines and purpurins. Additional photosensitizers will be apparent to those skilled in the art and are included in the present invention.

Figure 4B:
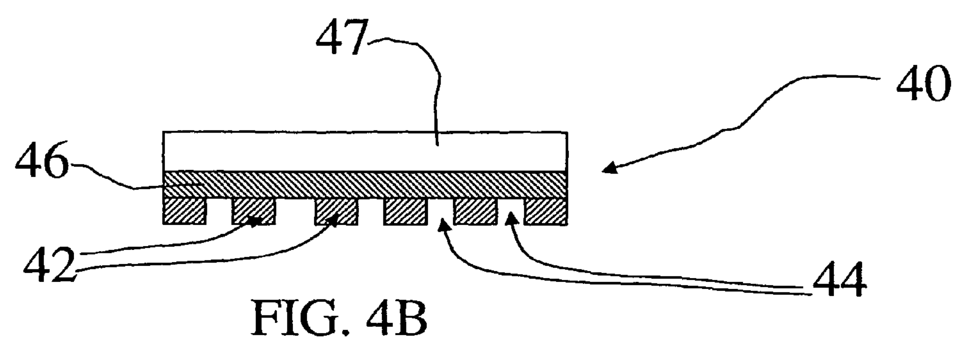

It is also contemplated that substrate 47 may be attached to mask 40, as seen in FIG. 4B. Substrate 47 may be attached either to layer 46, as in FIG. 4B, or to the shielding material of mask section 42. With substrate 47 attached to layer 46, mask 40 is preferably positioned such that mask section 42, as well as the transmitting portion of pattern section 44, is disposed closest to coating 36, while layer 46 is disposed between the shielding layer and the substrate. A preferred substrate comprises fused silica or quartz, however other substrates will be apparent.

A variety of materials and techniques may be used to form mask 40 having mask section 42 and pattern section 44. In a first embodiment, mask 40 is formed as a bilayer material. The first layer comprises a shielding material, as described above with respect to mask section 42. The second layer comprises the photocatalyst layer 46, also described previously. Optionally, substrate 47 may be included as a third layer. A portion of the shielding layer is then selectively removed, for example, using e-beam or traditional machining techniques, to expose layer 46 and form pattern section 44, as well as mask section 42.

In a second embodiment, mask 40 is formed of Poly(dimethylsiloxane) ("PDMS"). In this embodiment, PDMS mask 40 may be dipped in a solution of the photocatalyst just after curing. Alternatively, the photocatalyst may be painted, flame-coated, or vapor deposited on the surface. Portions exposed to the photocatalyst comprise pattern section 44, while other portions comprise mask section 42.

In a third embodiment, mask 40 comprises polymers, such as Polyvinyl chloride ("PVC") or polyethylene terephthalate. As with PDMS, polymer masks 40 may be selectively dipped in a solution containing the photocatalyst, or the photocatalyst may, for example, be painted, flame-coated or vapor deposited on the surface. For polymers that are good transmitters, UV stabilizers may be incorporated in/on the mask at all points outside of pattern section 44, thereby forming mask section 42.

In a fourth embodiment, mask 40 comprises a glass. A preferred technique for depositing photocatalyst layer 46 on the glass is through chemical vapor deposition (CVD). As in FIG. 4B, an additional shielding material may also be deposited. Additional, alternative materials for forming mask 40, as well as additional deposition techniques for forming mask section 42 and pattern section 44, will be apparent to those of skill in the art.

When using a photocatalytic semiconductor layer 46, energy source 50 preferably comprises a UV or x-ray lamp or laser. Energy source 50 generates energy quanta above the band gap of photocatalytic semiconductor layer 46. When using a photosensitizer layer 46, energy source 50 preferably comprises a visible light source, such as a light source with a wavelength between about 550-850 nm, for example, a visible laser light source, such as a Helium Neon ("HeNe") laser. Energy source 50 is capable of exciting photosensitizer layer 46. Other energy sources will be apparent to those of skill in the art. Energy source 50 may be pulsed in order to control an extent of radical generation and diffusion.

Medium M preferably comprises a medium capable of generating radical species in the presence of electron hole pairs or excited molecules, such as an oxygen- or nitrogen-containing medium. Medium M may be either organic or inorganic and is preferably fluidic, for example, a gaseous medium, a liquid medium, an aqueous medium, a gel, water, or air. Furthermore, medium M preferably comprises an oxidant, such as oxygen, nitrogen, oxidizing ions, Redox species, Redox mediators, or electron transfer agents. The medium may also or alternatively contain stabilizing agents, such as selenium, zinc, lipoic acid, methionine, cysteine, or N,N Dimethyl glycine. As yet another alternative, medium M may comprise more inert conditions, such as vacuum or argon gas, in which case elements capable of generating radical species are attached to substrate 30 or mask 40. Other mediums will be apparent to those of skill in the art.

Figure 4C:
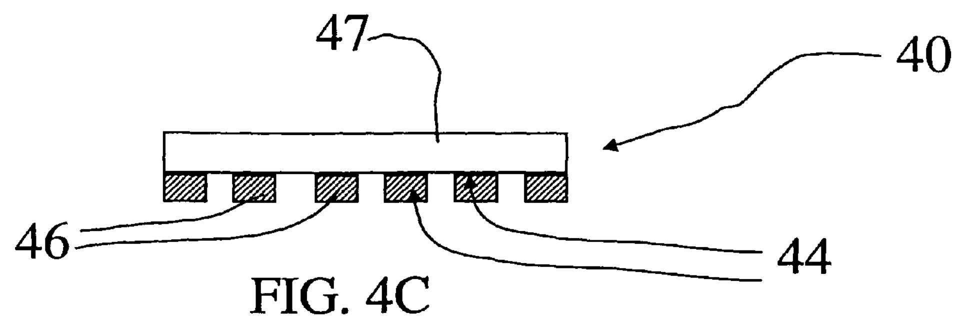
Figure 5A:
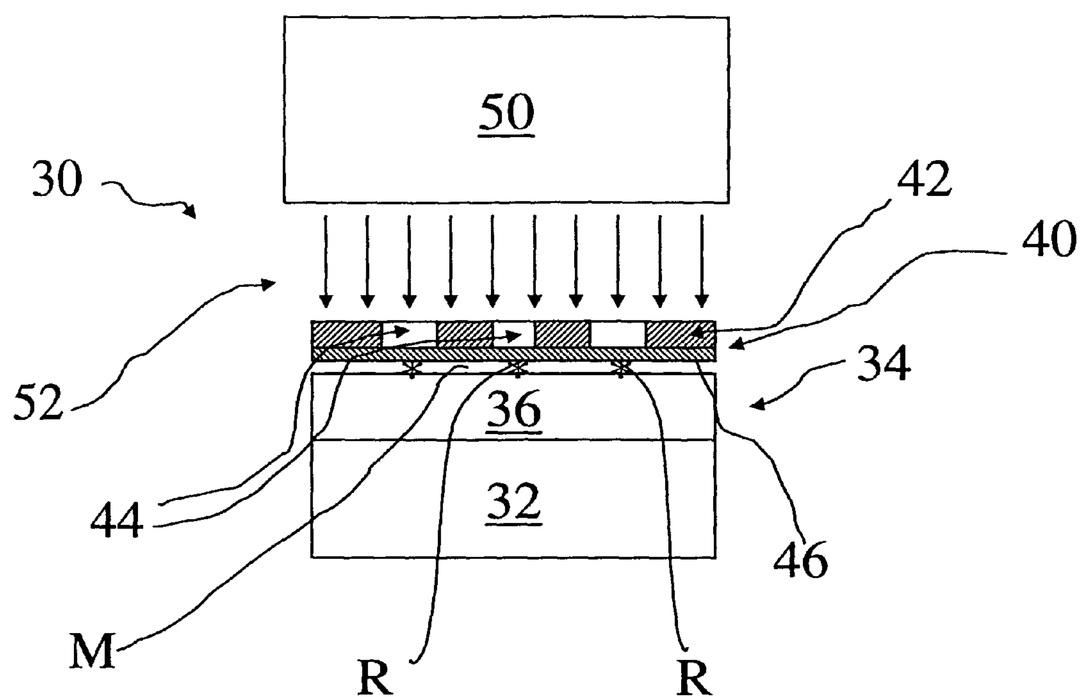
FIGS. 5A and 5B are schematic representations of a method of patterning a surface in accordance with the present invention, utilizing the apparatus of FIG. 4.

Referring to FIG. 5, in conjunction with FIGS. 2-4, a method for using the apparatus of FIG. 4 is described. As seen in FIG. 5A, mask 40 is brought into close proximity or contact with surface 34. Energy source 50 is activated and irradiates mask 40 with incident light 52. Mask section 42 of mask 40 inhibits incident light 52 from irradiating surface 34. However, where incident light 52 strikes pattern section 44 of mask 40, it generates radical species. As discussed previously with respect to FIGS. 2A and 2B, when photocatalyst layer 46 comprises a photocatalytic semiconductor, electron hole pairs are generated within the photocatalytic semiconductor because incident light 52 excites layer 46 with energy above the band gap of the semiconductor. As discussed previously with respect to FIG. 2C, when photocatalyst layer 46 comprises a photosensitizer, incident light 52 excites the photosensitizer in a manner capable of generating radical species upon contact with appropriate molecules, for example, oxygen molecules or thiohydroxamic esters.

Figure 5B:
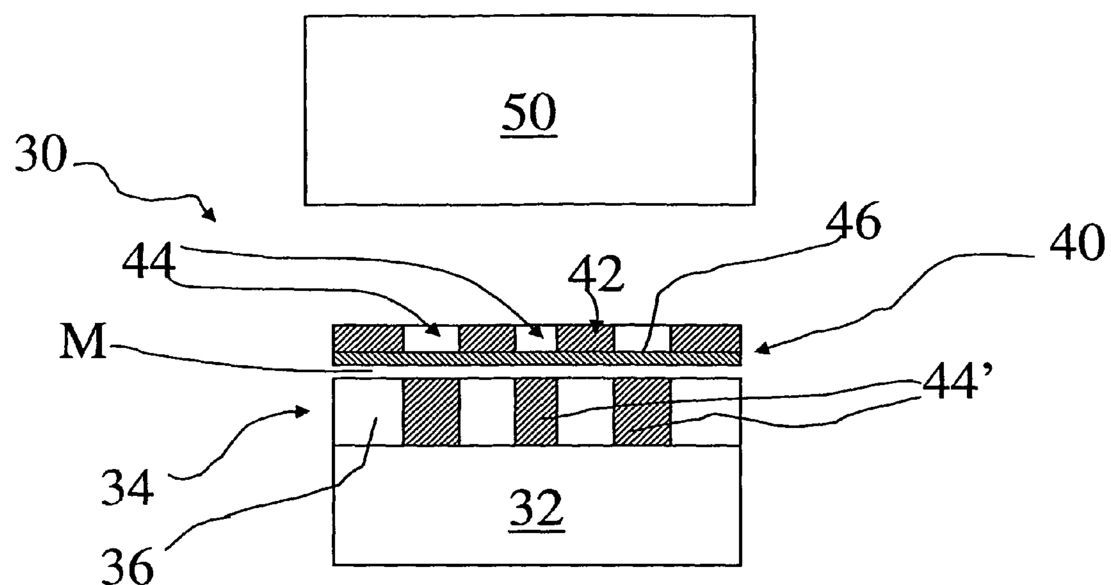

The electron hole pairs or excited molecules generate radical species R at the interface of medium M and layer 46. Radical species typically are capable of traveling on the order of 100 nm. It is expected that radical species R will be transferred from the interface of medium M and layer 46 to the interface of medium M and oxidizable coating 36 of surface 34 along a substantially shortest distance path. As seen in FIG. 5B, and discussed previously with respect to FIG. 3, the radical species locally oxidize coating 36 to form pattern 44' on surface 34 of substrate 32. Pattern 44' replicates the shape of pattern section 44 of mask 40 on surface 34.

Such local patterning through chemical modification of coating 36 is expected to alter the reactivity of the coating, and may either stabilize or destabilize pattern 44'. Unaffected adsorbed material optionally may be used for a second chemical step, for example, a second masking step.

Coating 36 may, for example, be used in a manner similar to the positive and negative resist coatings used in photolithography, as discussed hereinabove with respect to FIG. 1. Thus, coating 36 may be removed at all points on surface 34 disposed within pattern 44', for example, via a secondary rinse. Alternatively, coating 36 may be removed at all points on surface 34 that are not disposed within pattern 44'.

A significant advantage of the present invention, as compared to prior art photolithography techniques, is that the portion of pattern section 44 of mask 40 comprising photocatalyst layer 46 is expected to enable patterning of features in coating 36 of surface 34 that are significantly smaller than the wavelength of light generated by energy source 50. When using a photocatalytic semiconductor, this is possible because the radical species generated via photocatalytic semiconductor layer 46 have a dimension on the order of sub-angstroms, as compared to incident light 52, which has a dimension on the order of nanometers. Likewise, when using photosensitizers, the radical species generated with photosensitizer layer 46 are expected to be significantly smaller than the wavelength of incident light. Thus, pattern section 44 of mask 40 is preferably capable of patterning surfaces with features having resolutions less than about 100 nm, and even more preferably less than about 10 nm. Resolution of pattern 44' may be controlled, for example, by controlling the size of features within pattern section 44, and/or by controlling the distance between mask 40 and surface 34.

Another significant advantage of the present invention is that it is expected that the methods and apparatus described herein may be used in conjunction with a variety of oxidizable surface coatings 36. In a first embodiment, the surface coatings comprise alkane thiols. Alkane thiols are described in greater detail in U.S. Pat. No. 4,690,715 to Allara et al., U.S. Pat. No. 5,512,131 to Kumar et al., U.S. Pat. No. 5,686,548 to Grainger et al., U.S. Pat. No. 6,020,047 to Everhart, U.S. Pat. No. 6,183,815 to Enick et al., and U.S. Pat. No. 6,048,623 to Everhart et al., all of which are incorporated herein by reference. In a second embodiment, the coatings comprise thioethers. Thioethers, including their oxidation characteristics and their capabilities for selective modification, are described in greater detail in U.S. Patent Application Publication 2003/0059906 to Hubbell et al., as well as pending U.S. patent application Ser. No. 10/246,362 to Hubbell et al. (corresponding to PCT publication WO 03/024897), filed Sep. 18, 2002, and U.S. patent application Ser. No. 10/246,500 to Hubbell et al. (corresponding to PCT publication WO 03/024186), filed Sep. 18, 2002, all of which are incorporated herein by reference. In a third embodiment, the coatings comprise unsaturated materials, i.e. materials comprising double or triple bonds. Coatings comprising reactive saturated materials are also contemplated, for example, materials comprising chlorine or bromine. In yet another embodiment, the surface coatings comprise metallic oxides, or bare metal substrates capable of oxidizing. Other coatings will be apparent to those skilled in the art.

In an alternative embodiment of apparatus 30, mask section 42 of mask 40 is removed. As seen in FIG. 4C, photocatalyst layer 46 is deposited directly onto substrate 47 in a desired pattern, thereby forming pattern section 44. Removal of mask section 42 is significant in that many oxidizable surface coatings 36 would spontaneously oxidize in the presence of incident light 52 of adequate power. For this reason, mask section 42 provides shielding in the embodiments of FIGS. 4A and 4B to ensure that energy of incident light 52 only reaches surface 34 indirectly via radical species generated in pattern section 44.

In this alternative embodiment, the energy and power of incident light 52 generated by energy source 50 is specified such that, when using a photocatalytic semiconductor, the excitation energy delivered by incident light 52 is above the band gap of photocatalytic semiconductor layer 46; alternatively, when using a photosensitizer, energy delivered by incident light 52 is capable of exciting photosensitizer layer 46 to a singlet state. Furthermore, the excitation energy of incident light 52 preferably is specified such that it is below the power typically required to cause spontaneous oxidation of oxidizable surface coating 36. Thus, incident light 52 that passes through mask section 42 of mask 40, without contacting photocatalyst layer 46, irradiates coating 36 without causing oxidation. Oxidation still only occurs locally at locations on surface 34 that are contacted by radical species generated within pattern section 44, i.e. oxidation only occurs within pattern 44' of surface 34.

When using a photocatalytic semiconductor layer 46, the band gap energy of the photocatalytic semiconductor is dictated by:

$$E=h\nu \tag{6}$$

where h is Plank's constant and equals $1.603\times10^{-19}$, and E is the band gap energy of layer 46. Since $\nu$ is the frequency of incident light 52, and is related to the wavelength $\lambda$ of the incident light by:

$$\nu=C/\lambda \tag{7}$$

where C equals the speed of light, the excitation energy of incident light 52 can be specified such that it is above the band gap energy E of photocatalytic semiconductor layer 46 by choosing an energy source 50 capable of generating incident light 52 of appropriate wavelength. As an example, when layer 46 comprises TiO2, the band gap energy is 3.2 eV, which may be generated by the wavelength of light produced with either a UV or x-ray energy source 50.

Next, it is believed that the power required for spontaneous oxidation of coating 36 is dependent on Boltzmann's probabilistic equation, which follows an exponential decay law such that, for the purposes of the present invention, a probability of oxidation is expected to decrease with decreasing power. By maintaining a power level having a low probability of spontaneously oxidizing the surface, it is expected that selective patterning may be achieved with the alternative embodiment of mask 40 described hereinabove. Reducing the amount of time which coating 36 is exposed to incident light 52 may also reduce a probability of oxidation.

Although the equations above are believed to describe the band gap energy of a photocatalytic semiconductor, and the probability of a surface coating oxidizing in appropriate media upon exposure to a given power level for a specified period of time, the present invention is primarily concerned with the end result, i.e. patterning. Thus, these equations are provided only for the benefit of the reader and should in no way be construed as limiting.

A significant advantage of the alternative embodiment of mask 40 described with respect to FIG. 4C is that the criticality of excluding incident light 52 from surface 34 is reduced. Thus, increased flexibility is obtained in designing mask 40. Furthermore, increased flexibility is obtained in specifying the direction from which incident light 52 illuminates pattern section 44. This, in turn, increases flexibility in the positioning of energy source 50. For example, in this alternative embodiment, energy source 50 may illuminate pattern section 44 from the side, from an angle, or from below mask 40, as compared to just from above/through mask 40.

Figure 6A:
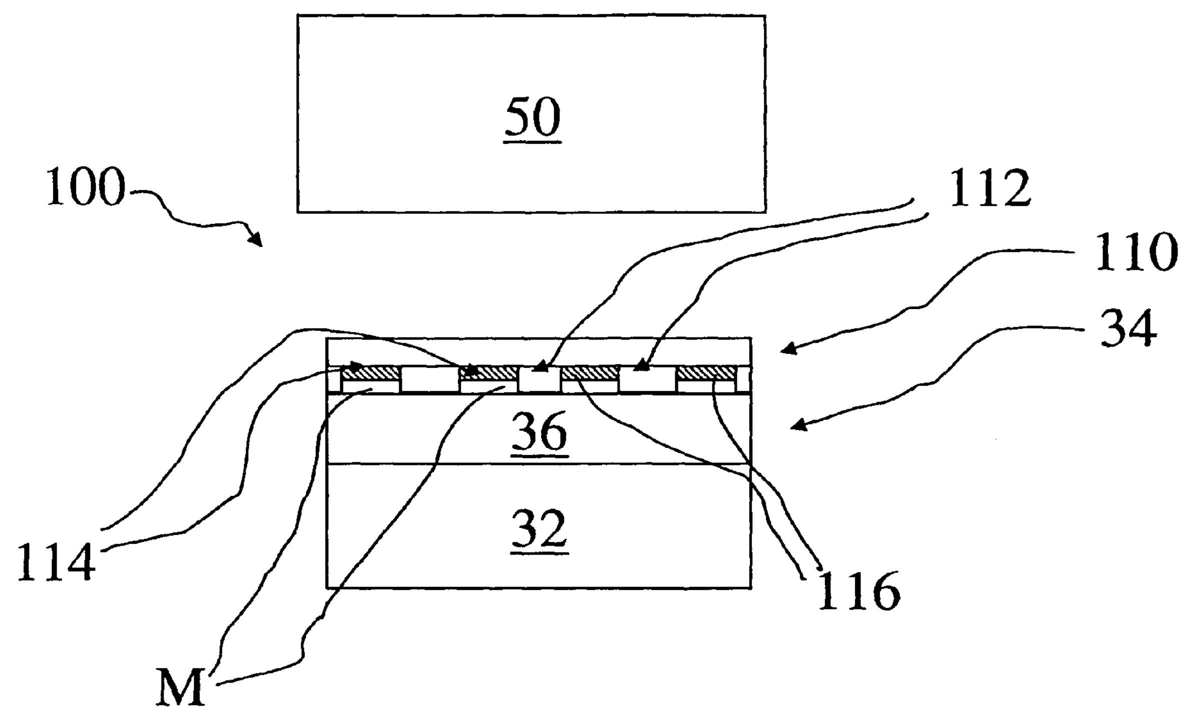
FIGS. 6A and 6B are a schematic representation of an alternative embodiment of apparatus constructed in accordance with the present invention.

Referring now to FIG. 6, alternative embodiments of apparatus in accordance with the present invention are described. In FIG. 6A, as with apparatus 30, apparatus 100 comprises substrate 32 having surface 34 with oxidizable coating 36. Apparatus 100 also comprises energy source 50 and medium M. Apparatus 100 still further comprises stamp 110 having contact section 112 and pattern section 114 with photocatalyst layer 116. As with apparatus 30, when layer 116 comprises a photocatalytic semiconductor, energy source 50 generates energy quanta above the band gap of the photocatalytic semiconductor, and when layer 116 comprises a photosensitizer, energy source 50 is capable of exciting the photosensitizer. Oxidizable coating 36 and photocatalyst layer 116 are immersed in medium M. Stamp 110 is disposed between substrate 32 and energy source 50.

Contact section 112 is adapted to substantially contact coated surface 34 at all points along the interface of stamp 110 with surface 34, except along pattern section 114. Contact section 112 preferably comprises a shielding material and/or stabilizing or quenching agents on its underside at points that contact surface 34. However, contact section 112 may alternatively comprise a material capable of transmitting incident light 52 generated by energy source 50, or may comprise a partially transmitting material.

When contact section 112 contacts coated surface 34, medium M is preferably substantially excluded from the interface between the contact section and the surface, thereby decreasing a likelihood of spontaneous oxidation of coating 36 due to irradiation with incident light 52. Pattern section 114 is preferably slightly recessed with respect to contact section 112, such that medium M remains in the interface between pattern section 114 and oxidizable coating 36 of surface 34, when contact section 112 contacts surface 34. The recession of pattern section 114 is preferably less than about 100 nm, which is on the order of the distance that radical species are able to travel.

Figure 6B:
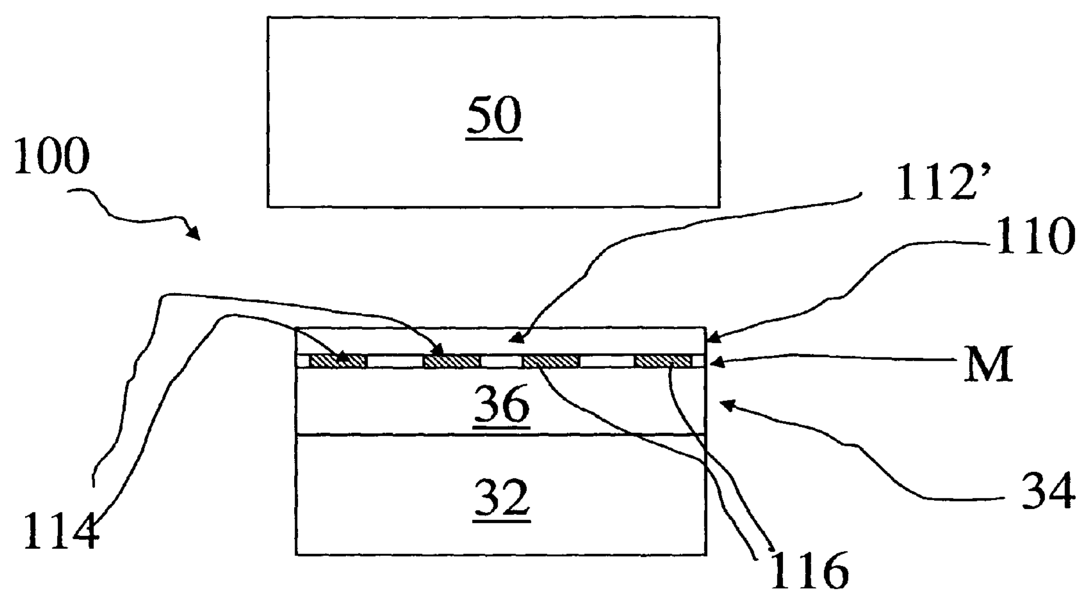

FIG. 6B provides an alternative embodiment of apparatus 100 in which contact section 112 of stamp 110 is replaced with transmission section 112', which is recessed with respect to pattern section 114. Pattern section 114, meanwhile, substantially contacts surface 34. In this embodiment, medium M remains in the minute interface between surface 34 and pattern section 114, in order to facilitate radical formation. It is expected that oxidation efficiency may increase as a function of decreasing distance between photocatalyst layer 116 and oxidizable coating 36. Furthermore, if quenching species are disposed, for example, on the underside of masking section 112', recession of section 112' may decrease a likelihood of spontaneous oxidation of coating 36 via transmission of incident light 52 through masking section 112'. Alternatively, when transmission section 112' transmits incident light 52, the light may be tuned such that it excites photocatalyst layer 116, but does not induce spontaneous oxidation of coating 36 in the presence of medium M, as described hereinabove with respect to FIG. 4C.

Figure 7A:
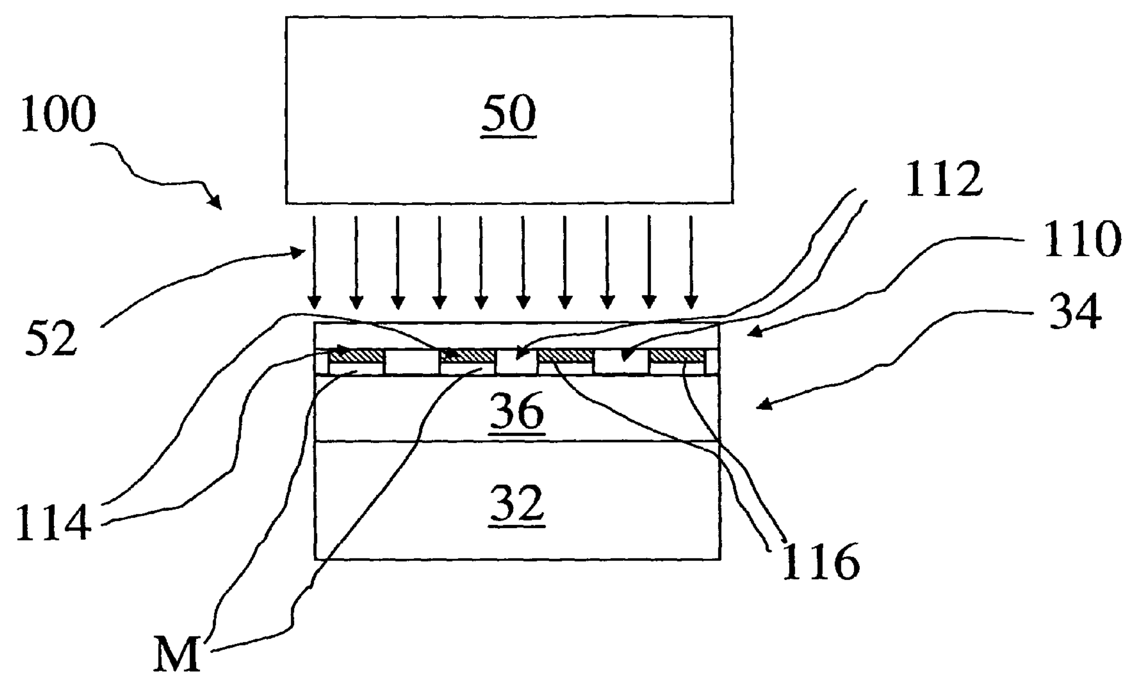
FIGS. 7A and 7B are schematic representations of a method of patterning a surface in accordance with the present invention, utilizing the apparatus of FIG. 6A.

With reference now to FIG. 7, a method of using the apparatus of FIG. 6A to selectively pattern surface 34 is described. Although this method is described with respect to the apparatus of FIG. 6A, it should be understood that a similar method may be used with the apparatus of FIG. 6B, as will be apparent to those of skill in the art. As seen in FIG. 7A, stamp 110 is brought into contact with surface 34 such that contact section 112 of stamp 110 substantially excludes medium M from the interface between contact section 112 and surface 34. Medium M remains in the interface between pattern section 114 and oxidizable coating 36 of surface 34. Energy source 50 is then activated and generates incident light 52, which passes through stamp 110.

Figure 7B:
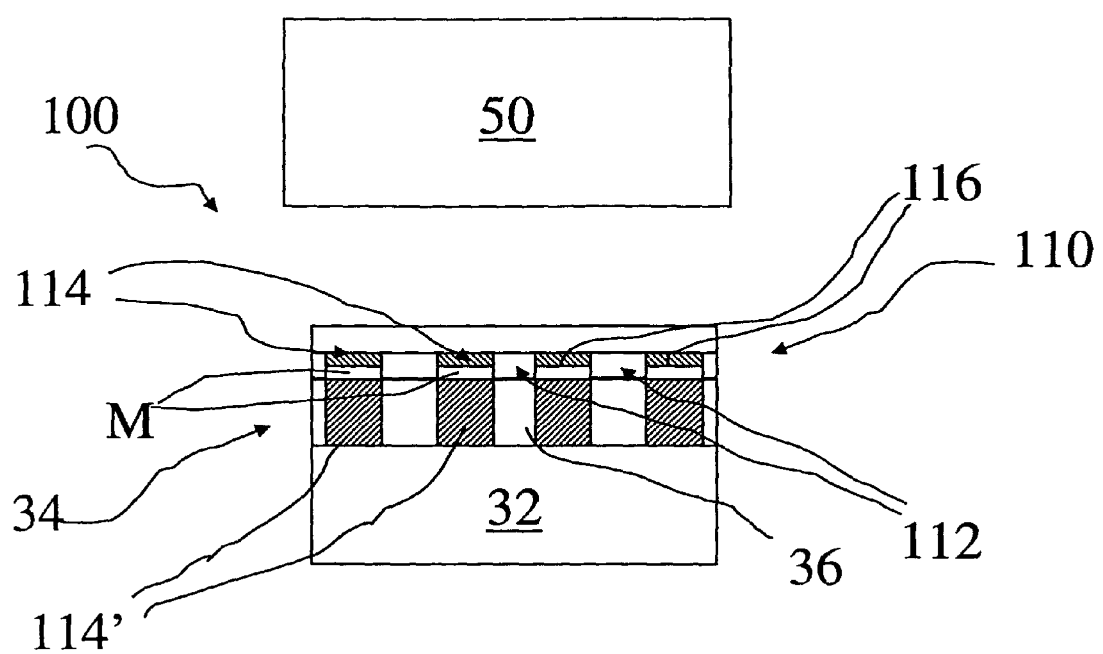

In pattern section 114, when photocatalyst layer 116 comprises a photocatalytic semiconductor, incident light 52 generates electron hole pairs within photocatalytic semiconductor layer 116. When photocatalyst layer 116 comprises a photosensitizer, incident light 52 excites the photosensitizer. These electron hole pairs or excited photosensitizer molecules generate radical species in the presence of medium M that are transmitted to surface 34 and locally oxidize coating 36 to form pattern 114' on surface 34. Pattern 114' replicates the geometry of pattern section 114 of stamp 110 on surface 34, as seen in FIG. 7B.

In the preferred embodiment of contact section 112, the contact section is shielded or quenched on its underside to prevent incident light 52 from irradiating coating 36 at points where contact section 112 contacts the coating. In an alternative embodiment where contact section 112 is not, or is only partly, shielded or quenched, incident light 52 passes through contact section 112 and irradiates oxidizable coating 36 of surface 34. Advantageously, even if the power of incident light 52 is sufficient to spontaneously oxidize coating 36, since coating 36 is substantially excluded from medium M at all locations along contact section 112, the coating is unable to absorb the necessary molecules required for oxidation, e.g. oxygen. Thus, coating 36 cannot oxidize at locations in contact with contact section 112 that are excluded from medium M, and it is expected that surface 34 may be selectively patterned regardless of whether contact section 112 transmits incident light 52.

As with apparatus 30, a significant advantage of apparatus 100 and all embodiments of the present invention, as compared to prior art photolithography techniques, is that it is expected that pattern 114' on surface 34 may contain features that are significantly smaller than the wavelength of light generated by energy source 50. This is possible because the radical species generated via photocatalyst layer 46 have a dimension on the order of sub-angstroms, as compared to incident light 52, which has a dimension on the order of nanometers. Thus, pattern section 114 of stamp 110 is preferably capable of patterning surfaces with features having resolutions less than about 100 nm, and even more preferably less than about 10 nm. Resolution of pattern 114' on surface 34 may be controlled, for example, by controlling the size of features within pattern section 114, and by controlling the distance that pattern section 114 is recessed with respect to contact section 112, thereby altering dispersion of radical species.

Figure 8:
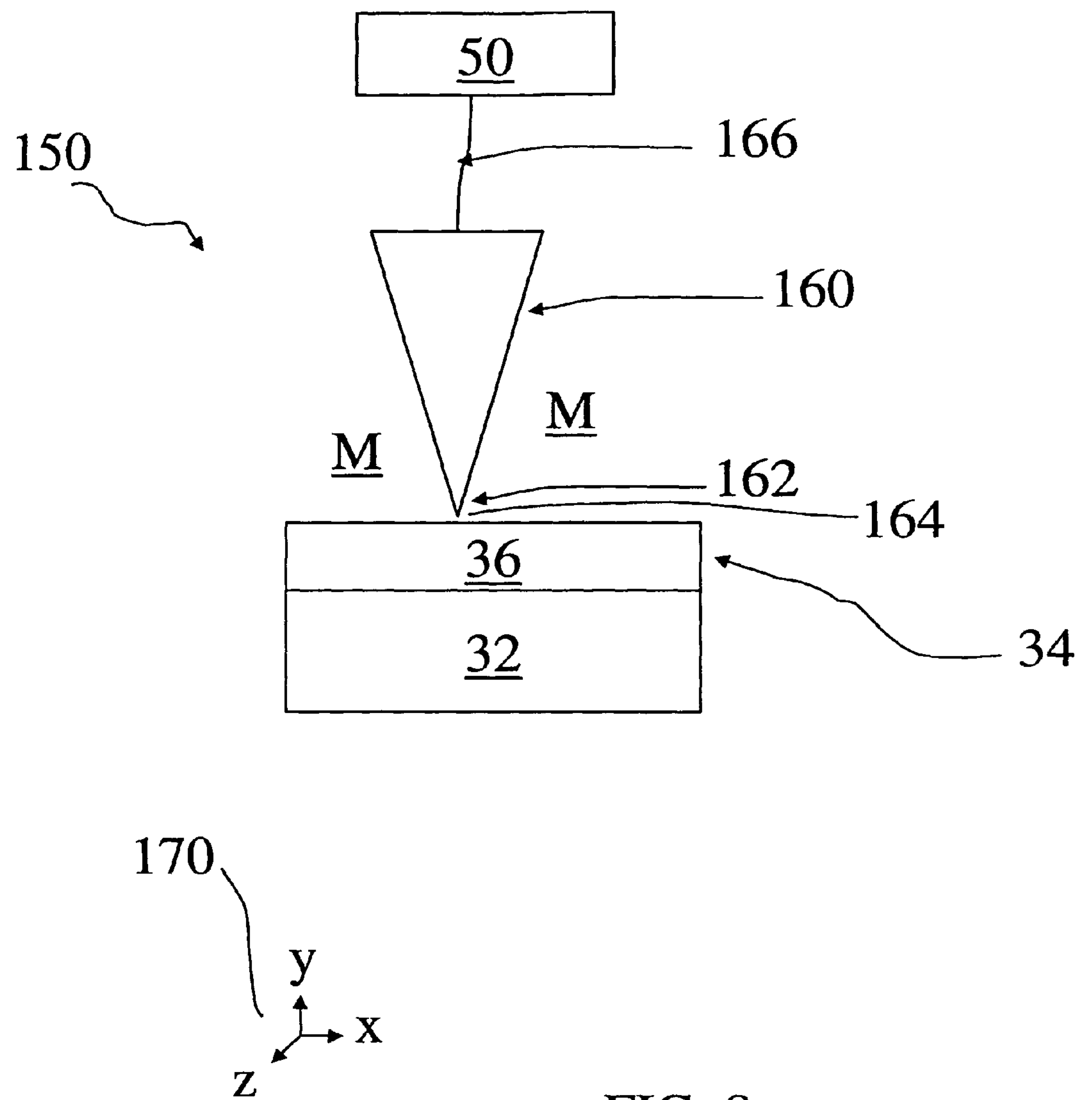
FIG. 8 is a schematic representation of yet another alternative embodiment of apparatus constructed in accordance with the present invention.

Referring now to FIG. 8, yet another alternative embodiment of apparatus in accordance with the present invention is described, wherein the mask or stamp is replaced with a scanning probe. As with apparatus 30 and 100, apparatus 150 comprises substrate 32 having surface 34 with oxidizable coating 36, as well as energy source 50 and medium M. Apparatus 150 further comprises scanning probe 160 having tip 162 with photocatalyst layer 164. Scanning probe 160 is able to translate in directions 170, for example, the X-, Y-, and/or Z-directions. Alternatively, directions 170 may comprise the r-, θ-, and/or ϕ-directions. Energy source 50 is coupled to tip 162 via coupling device 166, which may comprise, for example, a fiber optic cable or a near-field optical microscopy aperture. As previously, energy source 50 generates energy quanta capable of exciting photocatalyst layer 164 of probe 160, and oxidizable coating 36 and photocatalyst layer 164 are immersed in medium M.

Figure 9A:
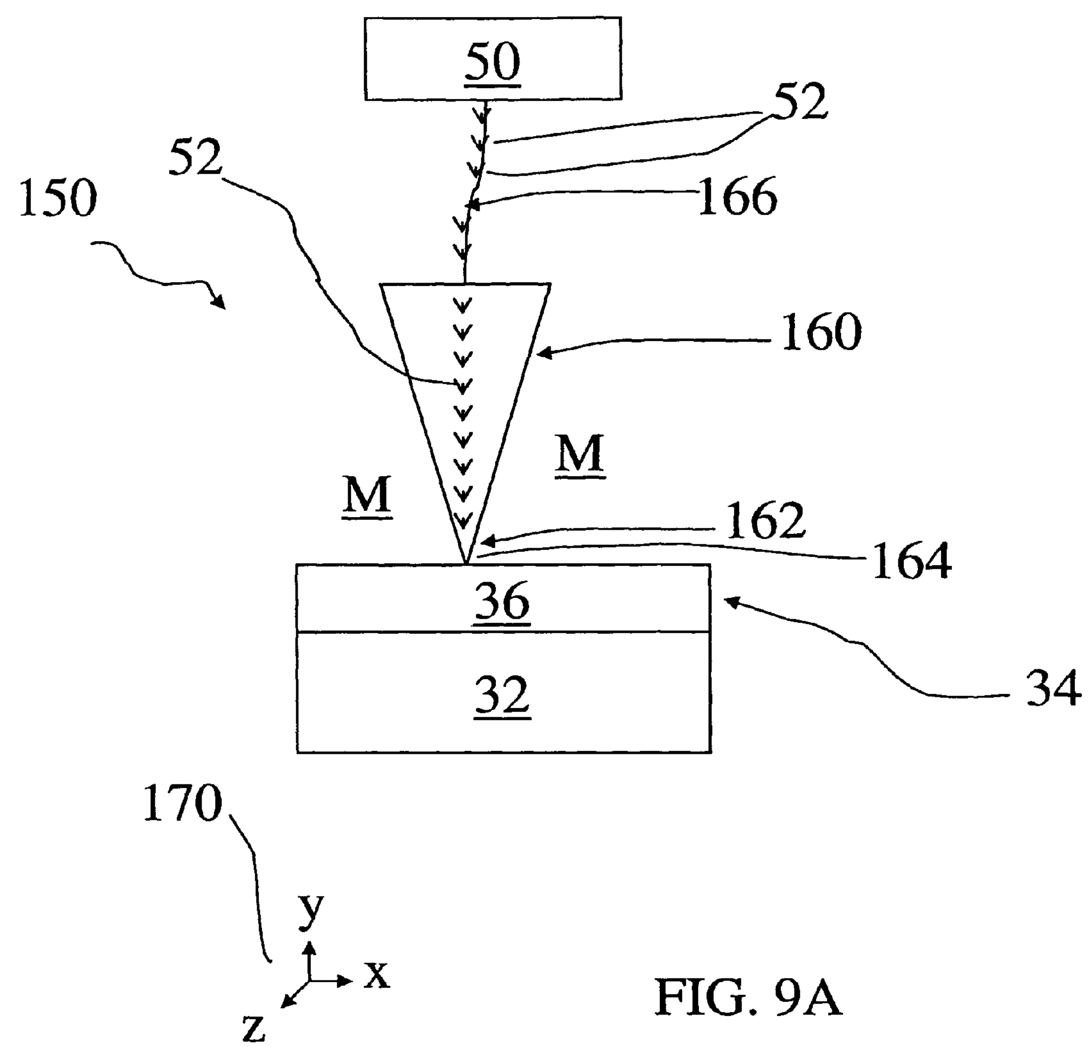
FIGS. 9A-9C are schematic representations of a method of patterning a surface in accordance with the present invention, utilizing the apparatus of FIG. 8.
Figure 9B:
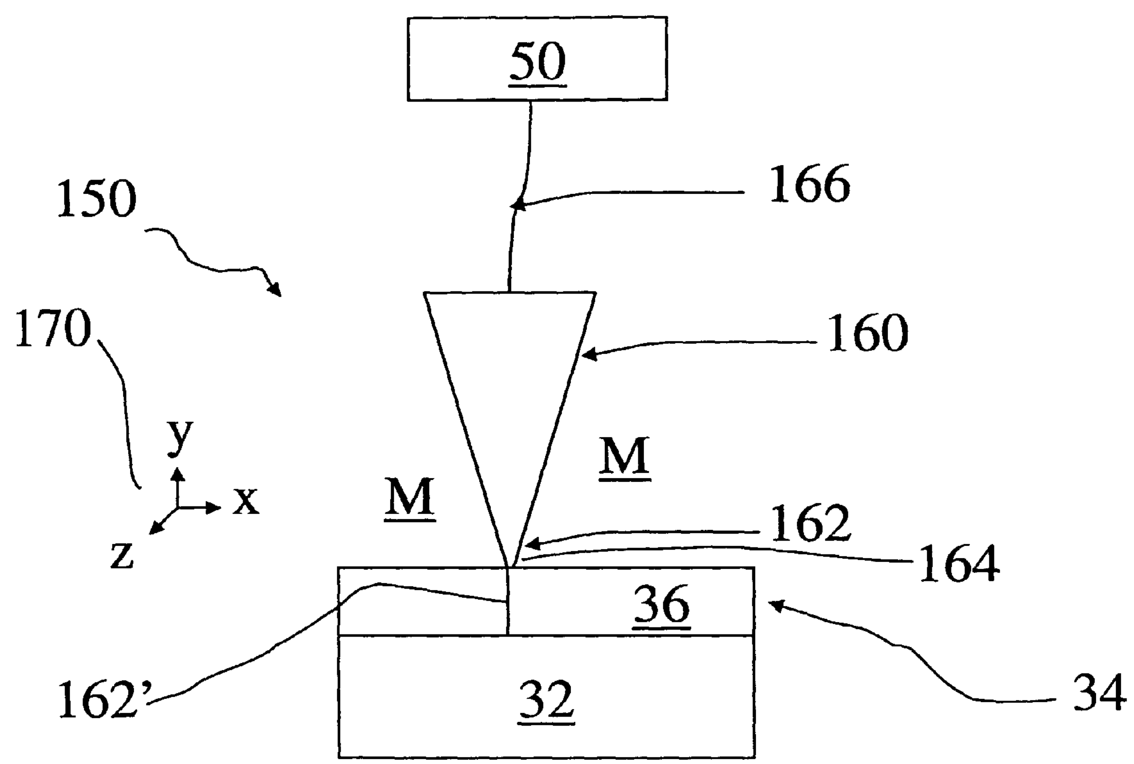
Figure 9C:
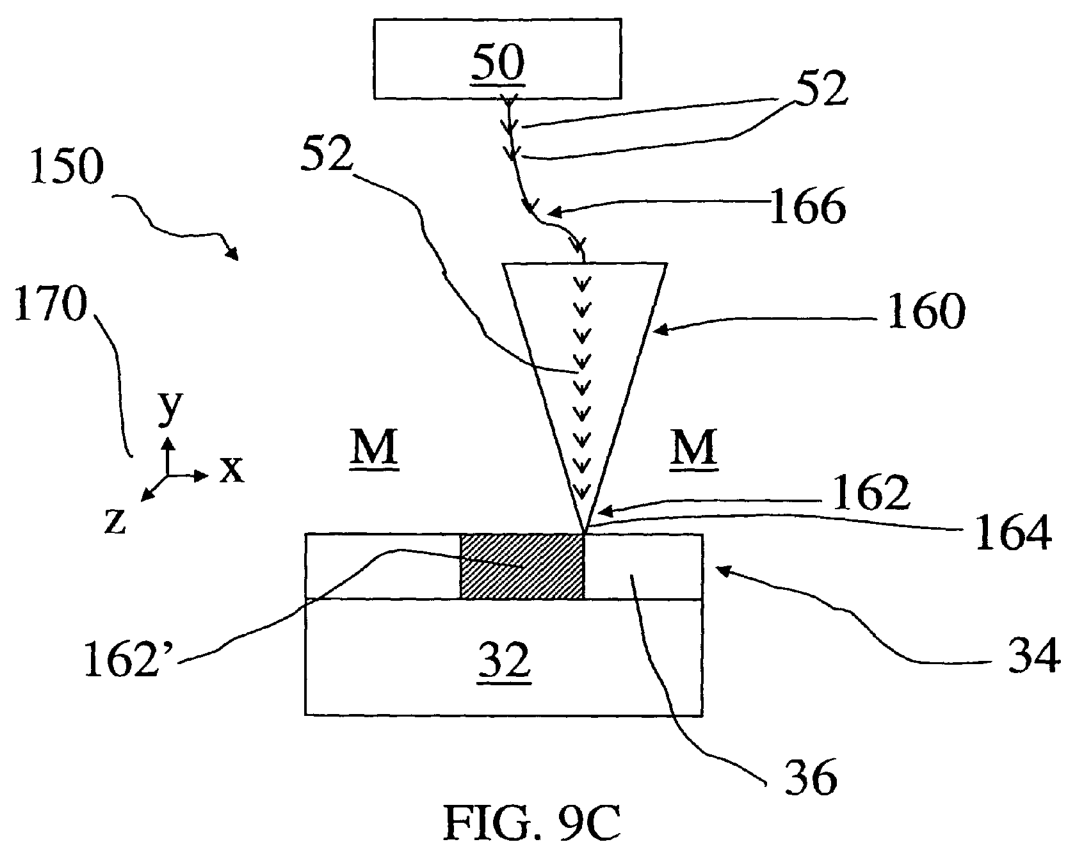

With reference to FIG. 9, a method of using the apparatus of FIG. 8 to selectively pattern a surface is provided. Scanning probe 160 is brought into close proximity or contact with surface 34, as seen in FIG. 9A. Energy source 50 is activated, and incident light 52 travels through coupling device 166 to tip 162 of probe 160. Incident light 52 excites photocatalyst 164 thereby forming radical species in the presence of medium M, which are transmitted to oxidizable coating 36 along a substantially shortest distance path. Oxidizable coating 36 oxidizes locally at the point where these radical species contact surface 34, i.e. at a point substantially directly below tip 162 of probe 160, thereby forming selective pattern 162' on surface 34, as seen in FIG. 9B. As discussed previously, it is expected that the dimension of pattern 162' advantageously may be significantly smaller than the wavelength of incident light 52. Probe 160 may then be scanned or translated in directions 170 while energy source 50 is activated to provide a dynamic pattern 162', which may be specified by an operator in real time, as seen in FIG. 9C.

Figure 10A:
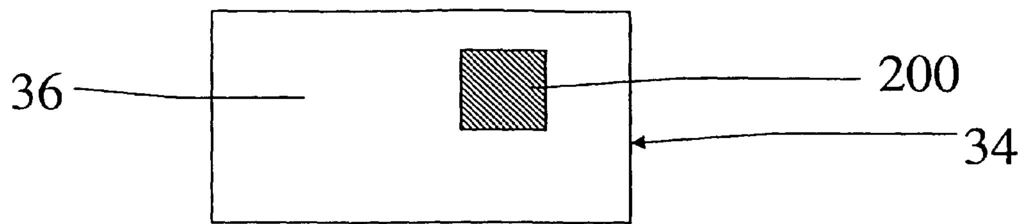
FIGS. 10A-10E are schematic representations of exemplary surface patterns that it is expected may be formed utilizing the methods and apparatus of the present invention.
Figure 10B:
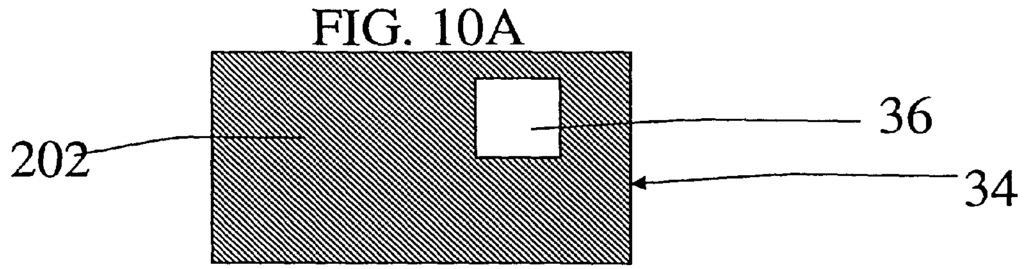
Figure 10C:
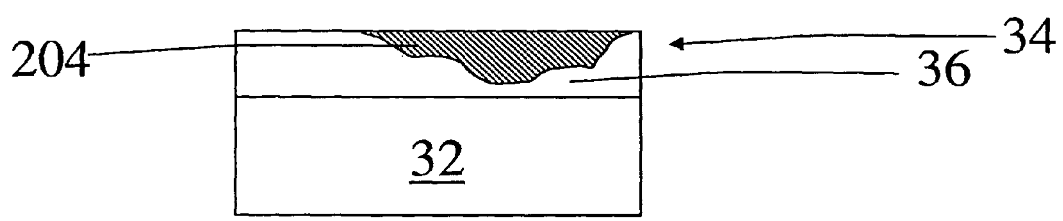
Figure 10D:
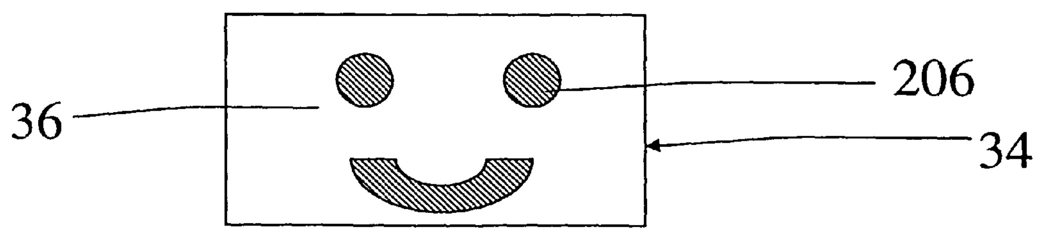
Figure 10E:
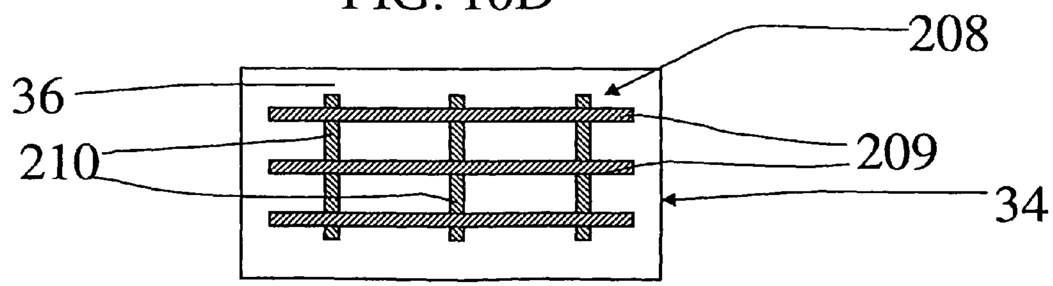

The use of scanning probe 160 may be advantageous in some applications because it provides highly localized oxidation of surface 34. Additionally, the distance between probe tip 162 and surface 34 may be finely adjusted to alter the resolution of pattern 162', for example, by modulating dispersion of radical species between tip 162 and surface 34. Furthermore, the resolution of pattern 162' may be modulated by altering the cross-section of layer 164 disposed on tip 162. Further still, by translating scanning probe 160 in any plane, a vast variety of selective patterns 162' may be provided on surface 34, i.e. a variety of patterns may be oxidatively 'carved' or 'painted' into the surface. An exemplary pattern 162' formed by translating scanning probe 160, is provided in FIG. 9C. Probe 160 may be translated at any desired rate, and/or with any desired power/energy parameters provided by source 50. Additionally, energy source 50 may be intermittently turned on and off, or pulsed, during translation of probe 160, thereby providing a selective pattern 162' that is discontinuous (see FIG. 10D). Moreover, an array of scanning probes may be utilized, as is known in the lithographic arts.

Referring now to FIG. 10, a variety of exemplary selectively patterned surfaces are provided. It is expected that these patterns will be achievable using any or all of apparatus 30, 100, or 150 described previously, or with additional embodiments of the present invention constructed in accordance with the present invention.

As discussed previously, local patterning of surface 34 of substrate 32 via chemical modification of coating 36 is expected to alter the reactivity of the coating, and may either stabilize or destabilize the local pattern. Unaffected adsorbed material optionally may be used for a second chemical step, for example, a second masking step.

Furthermore, coating 36 may, for example, be used in a manner similar to the positive and negative resist coatings used in photolithography, as discussed hereinabove with respect to FIG. 1. Thus, coating 36 may be removed at all points on surface 34 disposed within the local pattern, for example, via a secondary wash, rinse, or etch. Alternatively, coating 36 may be removed at all points on surface 34 that are not disposed within the local pattern.

For the purposes of FIG. 10, patterns refer to portions of coating 36 that have been removed from surface 34. In FIG. 10A, surface 34 comprises local pattern 200 that was formed by a process similar to a positive resist. In FIG. 10B, surface 34 comprises a local pattern 202 that was formed by a process similar to a negative resist. In FIG. 10C, which is shown in side-view, surface 34 comprises three-dimensional local pattern 204. Pattern 204 may be formed, for example, by controlling an extent of oxidation of coating 36 or by shaping surface 34 prior to patterning. In FIG. 10D, surface 34 comprises discontinuous local pattern 206. In FIG. 10E, surface 34 comprises two-step local pattern 208 having first pattern 209 and second pattern 210. First and second patterns 209 and 210 may be formed, for example, with two separate masks or stamps.

While preferred illustrative embodiments of the invention are described hereinabove, it will be apparent to one skilled in the art that various changes and modifications may be made therein without departing from the invention. For example, the substrate or surface on which the oxidizable coating is disposed may be provided with a voltage bias, for example, an anodic bias, to facilitate selective patterning of the surface. As another example, a mask or stamp may be provided with two or more different photocatalyst layers. When providing multiple photocatalytic semiconductor layers, each may comprise a different band gap potential. When providing multiple photosensitizer layers, each may comprise a different excitation energy. A mixture of photocatalytic and photosensitizer layers may also be provided. In such embodiments, multiple energy sources may be provided, each capable of generating energy at a different excitation level. Alternatively, a tuneable energy source may be provided.

The mask or stamp may then be irradiated with incident light of an energy capable of exciting the first photocatalyst layer, but not the second, different layer. This creates a first pattern on a target surface. A second pattern may then be provided by increasing the excitation energy of the incident light generated by the energy source to a level above the excitation energy of the second photocatalyst layer, thereby creating a second pattern on the target surface. Any number of patterns may be provided with this technique using a single stamp or mask. Alternatively, multiple masks or stamps may be used to generate multiple surface patterns on a target surface. Further still, incident light may be exposed to a photocatalyst layer in successive portions, thereby providing multiple surface patterns from a single stamp or mask.

The appended claims are intended to cover all such changes and modifications that fall within the true spirit and scope of the invention. Additionally, it should be understood that, in order to emphasize important aspects of the present invention, the FIGS. are schematic and have not been drawn to scale.

What is claimed is:

1. A method for selectively patterning an oxidizable surface, the method comprising:

providing a photosensitizer in close proximity or contact to the oxidizable surface without attaching the photosensitizer to the oxidizable surface;

exciting the photosensitizer;

generating radical species with the excited photosensitizer;

locally oxidizing the surface at points where the radical species contact the surface, thereby selectively patterning the surface; and removing the photosensitizer from close proximity or contact with the oxidizable surface while maintaining the oxidizable surface's selective pattern.

2. The method of claim 1, wherein locally oxidizing the surface at points where the radical species contact the surface further comprises transferring the radical species to the surface in the presence of an oxidant.

3. The method of claim 1, wherein providing a photosensitizer comprises providing a photosensitizer chosen from the group consisting of photofrins, texaphyrins, metallotexaphyrins, porphyrins, hematoporphyrins, chlorins, bacteriochlorins, phthalocyanines, purpurins, and combinations thereof.

4. The method of claim 1, wherein providing a photosensitizer comprises providing a photosensitizer disposed on a delivery device.

5. The method of claim 4, wherein providing a photosensitizer disposed on a delivery device comprises providing a photosensitizer disposed on a delivery device chosen from the group consisting of stamps, masks, probes, scanning probes, and combinations thereof.

6. The method of claim 4, wherein providing a photosensitizer disposed on a delivery device further comprises providing a photosensitizer disposed on a delivery device in a specified pattern.

7. The method of claim 6, wherein providing a photosensitizer disposed on a delivery device in a specified pattern further comprises fabricating the specified pattern using e-beam lithography.

8. The method of claim 1, wherein locally oxidizing the surface comprises locally oxidizing a surface chosen from the group consisting of alkane thiols, thioethers, unsaturated materials, saturated materials, bare metal surfaces, metal oxides, and combinations thereof.

9. The method of claim 1 further comprising:

providing a second photocatalyst in close proximity or contact to the surface;

exciting the second photocatalyst;

generating a second set of radical species with the second excited photocatalyst; and locally oxidizing the surface at points where the second set of radical species contact the surface, thereby selectively patterning the surface with a second pattern.

10. The method of claim 9, wherein providing a second photocatalyst further comprises providing a second photocatalyst having a different band gap potential or excitation energy than the photosensitizer.

11. The method of claim 1, wherein selectively patterning the surface comprises selectively patterning the surface with a pattern chosen from the group consisting of positive patterns, negative patterns, continuous patterns, discontinuous patterns, multi-step patterns, one-dimensional patterns, two-dimensional patterns, three-dimensional patterns, and combinations thereof.

12. The method of claim 1 further comprising applying a bias voltage to the oxidizable surface.

13. The method of claim 1, wherein selectively patterning the surface further comprises selectively patterning the surface with features having a size smaller than about 100 nm.

14. The method of claim 1, wherein exciting the photosensitizer further comprises exciting the photosensitizer with light having a wavelength, and wherein selectively patterning the surface further comprises selectively patterning the surface with features having a size smaller than the wavelength of the light.

15. The method of claim 1 wherein providing a photosensitizer further comprises providing a photosensitizer having a pattern, and wherein selectively patterning the surface further comprises replicating the photosensitizer's pattern on the surface to selectively pattern the surface.

16. A method for selectively patterning an oxidizable surface, the method comprising:

providing a photocatalyst in close proximity or contact to the oxidizable surface without attaching the photocatalyst to the oxidizable surface;

exciting the photocatalyst with light having a wavelength;

generating radical species with the excited photocatalyst; and locally oxidizing the surface at points where the radical species contact the surface, thereby selectively patterning the surface with features having a size smaller than the wavelength of the light.

17. The method of claim 16 wherein providing a photocatalyst further comprises providing a photocatalyst having a pattern with features smaller than the wavelength, and wherein selectively patterning the surface further comprises replicating the photocatalyst's pattern on the surface to selectively pattern the surface with features having a size smaller than the wavelength of the light.

18. The method of claim 16 further comprising removing the photocatalyst from close proximity or contact with the oxidizable surface while maintaining the oxidizable surface's selective pattern.

19. A method for selectively patterning an oxidizable surface, the method comprising:

providing a patterned photosensitizer in close proximity or contact to the oxidizable surface without attaching the patterned photosensitizer to the surface;

exciting the patterned photosensitizer;

generating radical species with the excited, patterned photosensitizer;

locally oxidizing the surface at points where the radical species contact the surface, thereby selectively patterning the surface by replicating the photosensitizer's pattern on the surface; and removing the photosensitizer from close proximity or contact with the oxidizable surface while maintaining the oxidizable surface's selective pattern.

20. The method of claim 19 wherein exciting the photosensitizer further comprises exciting the photosensitizer with light having a wavelength, wherein providing a patterned photosensitizer further comprises providing a photosensitizer having a pattern with features smaller than the wavelength, and wherein selectively patterning the surface by replicating the photosensitizer's pattern on the surface further comprises selectively patterning the oxidizable surface with features having a size smaller than the wavelength of the light.

* * * * *